US012804848B2

(12) United States Patent
Cui et al.

(10) Patent No.: US 12,804,848 B2
(45) Date of Patent: Nov. 17, 2026

(54) PACKAGING STRUCTURE

(71) Applicant: Huawei Digital Power Technologies Co., Ltd., Shenzhen (CN)

(72) Inventors: Zhaoxue Cui, Dongguan (CN); Ren Liu, Dongguan (CN); Lin Du, Dongguan (CN); Tao Liang, Dongguan (CN); Ping Li, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 246 days.

(21) Appl. No.: 18/731,522

(22) Filed: Jun. 3, 2024

(65) Prior Publication Data

US 2024/0324142 A1 Sep. 26, 2024

Related U.S. Application Data

(63) Continuation of application No. PCT/CN2023/084491, filed on Mar. 28, 2023.

(30) Foreign Application Priority Data

Apr. 28, 2022 (CN) ........................ 202221014984.5

(51) Int. Cl.
*H05K 7/20* (2006.01)
*B60R 16/03* (2006.01)
(Continued)

(52) U.S. Cl.
CPC ......... *H05K 7/20272* (2013.01); *B60R 16/03* (2013.01); *H02J 7/70* (2026.01);
(Continued)

(58) Field of Classification Search
CPC ...... H05K 7/20272; H05K 1/11; H05K 1/144; H05K 1/181; H05K 7/1427; H02J 7/70; B60R 16/03
(Continued)

(56) References Cited

U.S. PATENT DOCUMENTS

| | | | | |
|---|---|---|---|---|
| 5,914,860 A * | 6/1999 | Janko | .................... | F28F 21/084 361/710 |
| 5,978,220 A * | 11/1999 | Frey | ...................... | H10W 40/47 361/677 |

(Continued)

FOREIGN PATENT DOCUMENTS

| | | |
|---|---|---|
| CN | 104919903 A | 9/2015 |
| CN | 109413958 A | 3/2019 |

(Continued)

*Primary Examiner* — Anatoly Vortman
(74) *Attorney, Agent, or Firm* — Maier & Maier, PLLC

(57) ABSTRACT

A packaging structure is provided and may include a housing and a power component. The power component is disposed inside the housing. The housing may include a top cover and a bottom housing. The top cover may have a first heat transfer medium channel inside. The bottom housing may have a second heat transfer medium channel inside. The power component may include a first circuit board and a second circuit board. At least one first heating device may be disposed on the first circuit board. The first heating device may press against an inner wall of the top cover. At least one second heating device may be disposed on the second circuit board, and the second heating device may press against an inner wall of the bottom housing. When the foregoing structure is used, high power density and high heat dissipation efficiency can be achieved.

20 Claims, 8 Drawing Sheets

(51) Int. Cl.

| | |
|---|---|
| ***H02J 7/00*** | (2026.01) |
| ***H02J 7/70*** | (2026.01) |
| ***H05K 1/11*** | (2006.01) |
| ***H05K 1/14*** | (2006.01) |
| ***H05K 1/181*** | (2026.01) |
| ***H05K 7/14*** | (2006.01) |

(52) U.S. Cl.
CPC ............... *H05K 1/11* (2013.01); *H05K 1/144* (2013.01); *H05K 1/181* (2013.01); *H05K 7/1427* (2013.01)

(58) Field of Classification Search
USPC .......................................................... 361/699
See application file for complete search history.

(56) References Cited

U.S. PATENT DOCUMENTS

| | | | | |
|---|---|---|---|---|
| 6,031,751 | A * | 2/2000 | Janko | F28F 13/00 165/80.4 |
| 6,326,761 | B1 * | 12/2001 | Tareilus | H02M 7/003 318/722 |
| 6,956,742 | B2 * | 10/2005 | Pfeifer | F28F 3/12 257/E23.098 |
| 6,972,957 | B2 * | 12/2005 | Beihoff | H02M 7/003 361/689 |
| 7,463,485 | B1 * | 12/2008 | Nishimura | H05K 7/20854 361/689 |
| 7,675,748 | B2 * | 3/2010 | Matsushima | G11B 33/1426 361/699 |
| 7,679,909 | B2 * | 3/2010 | Spearing | H05K 7/20645 165/80.4 |
| 7,697,300 | B2 * | 4/2010 | Brandt | B60R 16/0239 361/728 |
| 8,059,404 | B2 * | 11/2011 | Miller | H02M 7/003 174/547 |
| 9,148,946 | B1 | 9/2015 | Singh et al. | |
| 9,210,834 | B2 * | 12/2015 | Nakatsu | H02M 7/003 |
| 9,295,185 | B2 * | 3/2016 | Icoz | H05K 7/20927 |
| 9,936,616 | B2 * | 4/2018 | Tachibana | H05K 7/20927 |
| 10,645,844 | B2 * | 5/2020 | Dariavach | H05K 7/20254 |
| 2007/0165376 | A1 * | 7/2007 | Bones | H10W 90/00 257/E25.031 |
| 2009/0021971 | A1 * | 1/2009 | Korich | H05K 7/20927 363/141 |
| 2019/0263280 | A1 * | 8/2019 | Tang | H05K 7/20263 |
| 2022/0039297 | A1 | 2/2022 | Smal et al. | |
| 2023/0261565 | A1 * | 8/2023 | Du | H02M 1/327 361/689 |

FOREIGN PATENT DOCUMENTS

| | | | |
|---|---|---|---|
| CN | 109606157 | A | 4/2019 |
| CN | 211064004 | U | 7/2020 |
| CN | 113260238 | B | 12/2021 |
| CN | 113939152 | A | 1/2022 |
| CN | 217957565 | U | 12/2022 |
| EP | 1713169 | A1 | 10/2006 |
| EP | 2506695 | B1 | 1/2018 |
| EP | 4404702 | A1 | 7/2024 |
| JP | 2008295139 | A | 12/2008 |

* cited by examiner

PACKAGING STRUCTURE

CROSS-REFERENCE TO RELATED APPLICATIONS

This application is a continuation of International Application No. PCT/CN2023/084491, filed on Mar. 28, 2023, which claims priority to Chinese Patent Application No. 202221014984.5, filed on Apr. 28, 2022. The disclosures of the aforementioned applications are hereby incorporated by reference in their entireties.

TECHNICAL FIELD

The embodiments relate to the field of electrical device technologies, and a packaging structure.

BACKGROUND

A developmental trend of packaging structures such as power supply modules is having increasingly large power. A common heat dissipation mode cannot meet a heat dissipation requirement, and a water cooling heat dissipation mode is increasingly widely used. A die-casting fitting may be used as a housing of a high-power water-cooled power supply module and a water channel may be made on the housing or a dedicated heat sink. Heating devices such as an insulated gate bipolar transistor (IGBT), a magnetic device, and a metal-oxide-semiconductor field-effect transistor (MOSFET) are attached to a wall of the water channel to dissipate heat. Only a single circuit board can be disposed on this type of water-cooled power supply module, and power density is low.

SUMMARY

The embodiments may provide a packaging structure, to resolve a problem that power density of an existing packaging structure is low.

The embodiments may provide a packaging structure. The packaging structure may include a housing and a power component. The housing may have first accommodation space inside. The power component may be disposed in the first accommodation space. The housing may include a top cover and a bottom housing. The top cover and the bottom housing are connected to form the housing. The top cover may have a first heat transfer medium channel inside. The bottom housing may have a second heat transfer medium channel inside. The first heat transfer medium channel and the second heat transfer medium channel are separately configured to communicate with an external heat dissipation circulation system. The power component may include a first circuit board and a second circuit board. The first circuit board and the second circuit board may be disposed opposite to each other. The first circuit board may be disposed on the top cover, and the second circuit board may be disposed on the bottom housing. At least one first heating device may be disposed on the first circuit board. The first heating device may press against an inner wall of the top cover. At least one second heating device may be disposed on the second circuit board, and the second heating device may press against an inner wall of the bottom housing.

The first circuit board and the second circuit board may be disposed inside the housing, so that power density of the packaging structure can be improved. The first circuit board and the second circuit board are disposed opposite to each other and are respectively disposed on the top cover and the bottom housing. In this way, internal space of the housing can be fully utilized, and assembly of the circuit boards is convenient. The first heat transfer medium channel and the second heat transfer medium channel are respectively disposed on the top cover and the bottom housing. A heat dissipation area is large and heat dissipation efficiency is high, so that the first heating device on the first circuit board and the second heating device on the second circuit board can effectively dissipate heat. In this way, working reliability of a device is improved.

A first guide assembly may be disposed between the first circuit board and the second circuit board. The first guide assembly may include a guide pin and a guide tube. The guide pin may be disposed on the first circuit board, and the guide tube may be disposed on the second circuit board. The guide pin and the guide tube may be plug-connected. In this way, the top cover and the bottom housing are preliminarily guided for the connection, so that the top cover and the bottom housing can be accurately connected.

A second guide assembly may be disposed between the first circuit board and the second circuit board. The second guide assembly may include a first signal connection terminal and a second signal connection terminal. The first signal connection terminal may be disposed on the first circuit board, and the second signal connection terminal may be disposed on the second circuit board. The first signal connection terminal and the second signal connection terminal may be plug-connected. In this way, the top cover and the bottom housing can be precisely guided for the connection, so that the top cover and the bottom housing can be more accurately connected.

A third heating device may be disposed in the housing. The third heating device may press against one or both of the bottom housing and the top cover. The third heating device may be a device with a high height. Devices are flexibly arranged inside the housing.

The first circuit board may have a first avoidance notch. The third heating device may pass through the first avoidance notch to press against the inner wall of the top cover. The second circuit board may have a second avoidance notch. The third heating device may pass through the second avoidance notch to press against the inner wall of the bottom housing. In this way, the third heating device, the first circuit board, and the second circuit board may be densely arranged. This arrangement does not need to avoid the entire first circuit board and the entire second circuit board. Therefore, devices have a highly flexible layout and occupy small space.

A connector may be disposed on an outer wall of the bottom housing. The connector is configured to communicate with the external heat dissipation circulation system. The connector may separately communicate with the first heat transfer medium channel and the second heat transfer medium channel. The connector is located outside the housing, to implement water and electricity isolation and improve reliability of the packaging structure.

A first connection channel, a second connection channel, and a third connection channel may be disposed inside the connector. A first end of the first connection channel is configured to communicate with the external heat dissipation circulation system, and a second end of the first connection channel may communicate with a first end of the first heat transfer medium channel. A first end of the second connection channel may communicate with a second end of the first heat transfer medium channel, and a second end of the second connection channel may communicate with a first end of the second heat transfer medium channel. A first end of the third connection channel may communicate with a second end of the second heat transfer medium channel, and a second end of the third connection channel is configured to communicate with the external heat dissipation circulation system. In this way, the first heat transfer medium channel and the second heat transfer medium channel may communicate with the external heat dissipation circulation system, and the first heat transfer medium channel and the second heat transfer medium channel are connected in series.

A fourth connection channel, a fifth connection channel, a sixth connection channel, and a seventh connection channel may be disposed inside the connector. A first end of the fourth connection channel may communicate with a first end of the first heat transfer medium channel, and a second end of the fourth connection channel may communicate with a first end of the second heat transfer medium channel. A first end of the fifth connection channel may communicate with a second end of the first heat transfer medium channel, and a second end of the fifth connection channel may communicate with a second end of the second heat transfer medium channel. A first end of the sixth connection channel is configured to communicate with the external heat dissipation circulation system, and a second end of the sixth connection channel may communicate with the fourth connection channel. A first end of the seventh connection channel is configured to communicate with the external heat dissipation circulation system, and a second end of the seventh connection channel may communicate with the fifth connection channel. In this way, the first heat transfer medium channel and the second heat transfer medium channel may communicate with the external heat dissipation circulation system, and the first heat transfer medium channel and the second heat transfer medium channel are connected in parallel.

The connector and the bottom housing may be integrally formed. In this way, the connector may directly communicate with the second heat transfer medium channel, and reliability is high.

A sealing ring may be disposed at a joint between the connector and the first heat transfer medium channel. In this way, airtightness of the connection may be enhanced.

The first heat transfer medium channel may be U-shaped, and/or the second heat transfer medium channel may be U-shaped. In this way, there may be a large heat dissipation area.

The bottom housing may include a bottom wall and a plurality of first side walls. The plurality of first side walls may be disposed on the bottom wall in a circumferential direction of the bottom wall, and the plurality of first side walls are sequentially connected. The second heat transfer medium channel may be disposed on the bottom wall. In this way, heat dissipation of a device on a back side of the second circuit board can be implemented.

The second heat transfer medium channel may extend from the bottom wall to the first side wall. In this way, the heat dissipation of the device on the back side of the second circuit board can be implemented. In addition, heat dissipation of a device close to the first side wall of the bottom housing can also be implemented. The dissipation area is larger, and heat dissipation efficiency can be improved.

The top cover may have second accommodation space inside. A third circuit board may be disposed in the second accommodation space. At least one fourth heating device may be disposed on the third circuit board. The top cover may have a second side wall facing the bottom housing. The first heat transfer medium channel may be disposed in the second side wall. The fourth heating device may press against the second side wall. The first heating device may press against the second side wall. In this way, the packaging structure may have three circuit boards as a whole, and the packaging structure can have high power density.

DETAILED DESCRIPTION OF EMBODIMENTS

The following describes in detail the embodiments with reference to accompanying drawings.

For ease of understanding, an application scenario of a packaging structure is first described. The packaging structure provided in the embodiments may be applicable to an electrical device, may be used as a power supply module, and may be applied to the field of vehicle-mounted devices. For example, the packaging structure may be used as a power supply module of a vehicle-mounted charging device and may be used to implement a function such as vehicle charging.

A power supply module may be used as an example. A die-casting fitting may be used as a housing of an existing high-power water-cooled power supply module, and a water channel may be made on the housing or a dedicated heat sink. Heating devices such as an insulated gate bipolar transistor (IGBT), a magnetic device, and a metal-oxide-semiconductor field-effect transistor (MOSFET) are attached to a wall of the water channel to dissipate heat. Only a single circuit board can be disposed on this type of water-cooled power supply module, and power density is low.

In view of this, the embodiments may provide a packaging structure and may improve power density of a packaging structure.

Figure 1:
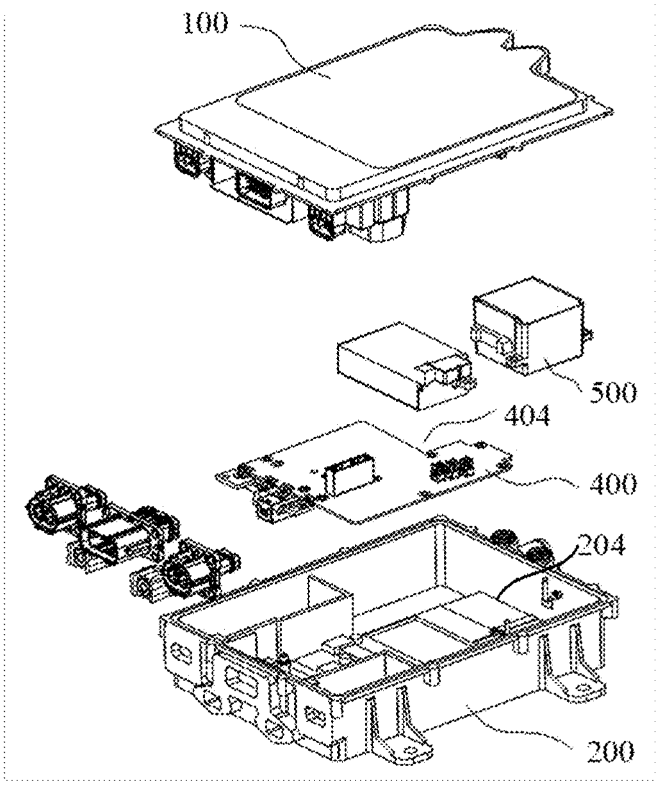
FIG. 1 is an exploded schematic diagram of a structure of a packaging structure according to an embodiment.
Figure 2:
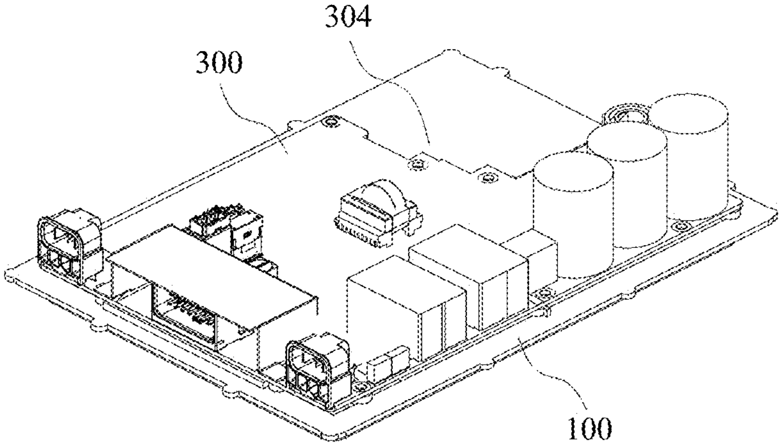
FIG. 2 is a schematic diagram of a partial structure of a packaging structure according to an embodiment.
Figure 3:
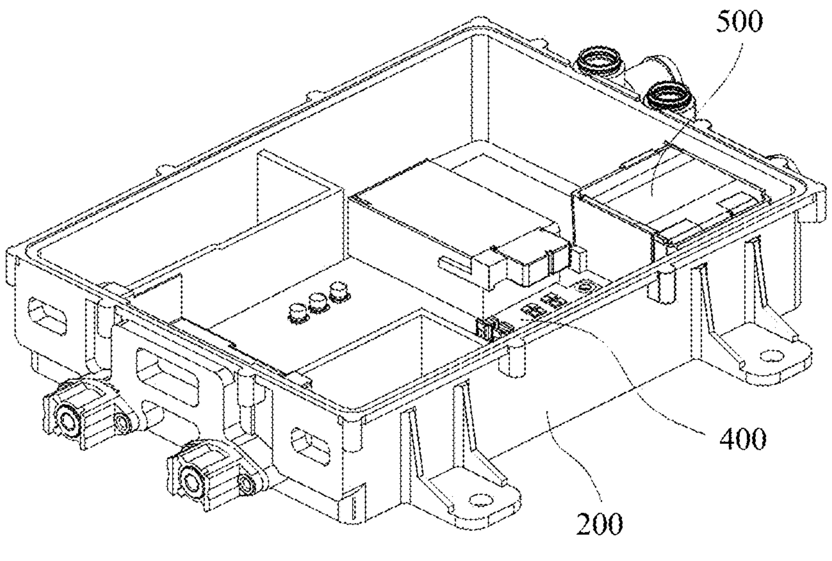
FIG. 3 is a schematic diagram of a partial structure of a packaging structure according to an embodiment.

First, refer to FIG. 1, FIG. 2, and FIG. 3. FIG. 1 is an exploded schematic diagram of a structure of a packaging structure according to an embodiment. FIG. 2 is a schematic diagram of a partial structure of a packaging structure according to an embodiment. FIG. 3 is a schematic diagram of a partial structure of a packaging structure according to an embodiment. As shown in FIG. 1, FIG. 2, and FIG. 3, the packaging structure provided in the embodiments may include a housing and a power component. The housing has first accommodating space 204 inside. The housing may include a top cover 100 and a bottom housing 200. The top cover 100 and the bottom housing 200 are connected to form the housing having the first accommodating space 204 inside. The top cover 100 may have a first heat transfer medium channel inside. The bottom housing 200 may have second heat transfer medium channel inside. The first heat transfer medium channel and the second heat transfer medium channel may separately communicate with an external heat dissipation circulation system. The external heat dissipation circulation system may use water as a heat transfer medium.

The power component is disposed in the first accommodating space 204. The power component may include a first circuit board 300 and a second circuit board 400. The first circuit board 300 and the second circuit board 400 may be disposed opposite to each other. A front side of the first circuit board 300 may be disposed opposite to a front side of the second circuit board 400. A back side of the first circuit board 300 faces the top cover 100. The first circuit board 300 may be fastened to the top cover 100 by using a connecting piece such as a screw. The back side of the first circuit board 300 is a side on the back of the front side of the first circuit board 300. A back side of the second circuit board 400 faces the bottom housing 200. The second circuit board 400 may be fastened to the bottom housing 200 by using a connecting piece such as a screw. The back side of the second circuit board 400 is a side on the back of the front side of the second circuit board 400. In an application, a component with a high height on the front side of the first circuit board 300 and a component with a high height on the front side of the second circuit board 400 may be arranged in a staggered manner. In this way, a distance between the first circuit board 300 and the second circuit board 400 may be small, space occupied by the first circuit board 300 and the second circuit board 400 may be small, and a volume of the housing may be small.

Figure 4:
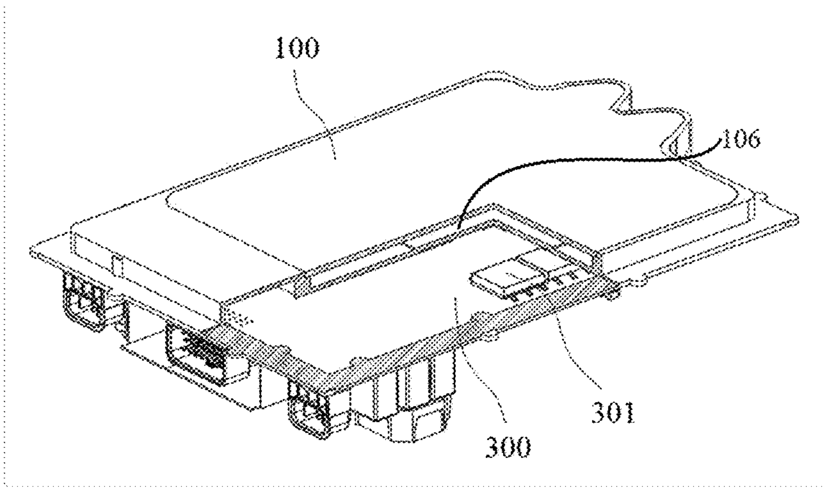
FIG. 4 is a schematic sectional view of a partial structure of a top cover of a packaging structure according to an embodiment.
Figure 5:
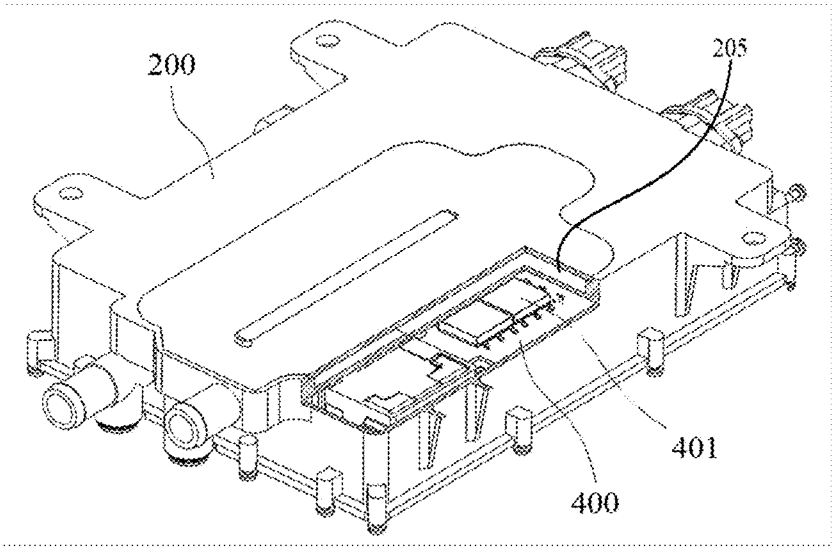
FIG. 5 is a schematic sectional view of a partial structure of a bottom housing of a packaging structure according to an embodiment.

FIG. 4 is a schematic sectional view of a partial structure of a top cover of a packaging structure according to an embodiment. FIG. 5 is a schematic sectional view of a partial structure of a bottom housing of a packaging structure according to an embodiment. As shown in FIG. 4 and FIG. 5, a first heating device 301 may be disposed on the first circuit board 300, and the first heating device 301 presses against an inner wall 106 of the top cover 100. The first heating device 301 may be disposed on the back side of the first circuit board 300. If a gap exists between the first heating device 301 and the inner wall 106 of the top cover 100 due to a part tolerance, an assembly tolerance, or the like, the gap may be filled with thermal adhesive. In actual application, there may be at least one first heating device 301, and there may be at least one type of the first heating device 301. For example, the first heating device 301 includes, but is not limited to, an IGBT, a magnetic device, a MOSFET, a diode, and the like. A second heating device 401 may be disposed on the second circuit board 400, and the second heating device 401 presses against an inner wall 205 of the bottom housing 200. The second heating device 401 may be disposed on the back side of the second circuit board 400. Similarly, if there is a gap between the second heating device 401 and the inner wall 205 of the bottom housing 200, the gap may be filled with the thermal adhesive. There may be at least one second heating device 401, and there may be at least one type of the second heating device 401.

According to the packaging structure provided in embodiments, the first circuit board 300 and the second circuit board 400 are disposed inside the housing, so that power density of the packaging structure can be improved. The top cover 100 and the bottom housing 200 are connected to form the housing, and the structure is simple. The first circuit board 300 and the second circuit board 400 are disposed opposite to each other and are respectively disposed on the top cover 100 and the bottom housing 200. In this way, internal space of the housing can be fully utilized, and assembly of the circuit boards is convenient. The first heat transfer medium channel and the second heat transfer medium channel are respectively disposed on the top cover 100 and the bottom housing 200. A heat dissipation area is large and heat dissipation efficiency is high, so that the first heating device 301 on the first circuit board 300 and the second heating device 401 on the second circuit board 400 can effectively dissipate heat. In this way, working reliability of a device is improved.

In a possible embodiment, a third heating device 500 is disposed in the housing. The third heating device 500 may press against both the bottom housing 200 and the top cover 100 or press against one of the bottom housing 200 and the top cover 100. For example, the third heating device 500 may be a device with a high height, such as a magnetic device. Two ends of the third heating device 500 in a height direction respectively press against the bottom housing 200 and the top cover 100 to dissipate heat. One end of the third heating device 500 may be fastened to the bottom housing 200 and press against the inner wall 205 of the bottom housing 200, and the other end of the magnetic device presses against the inner wall 106 of the top cover 100. It may be understood that one end of the third heating device 500 may be fastened to the top cover 100 and press against the inner wall 106 of the top cover 100, and the other end presses against the inner wall 205 of the bottom housing 200.

The first circuit board 300 may have a first avoidance notch 304. One end of the third heating device 500 may pass through the first avoidance notch 304 to press against the inner wall 106 of the top cover 100. The second circuit board 400 may have a second avoidance notch 404. The third heating device 500 may pass through the second avoidance notch 404 to press against the inner wall 205 of the bottom housing 200. In this way, the third heating device 500, the first circuit board 300, and the second circuit board 400 may be densely arranged. This arrangement does not need to avoid the entire first circuit board 300 and the entire second circuit board 400. Therefore, devices have a highly flexible layout and occupy small space.

Figure 6:
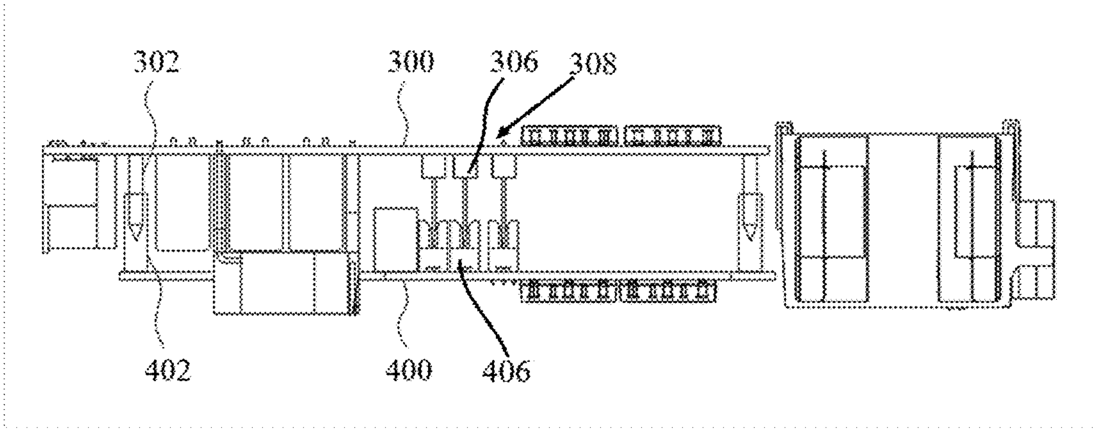
FIG. 6 is a schematic diagram of assembly of circuit boards of a packaging structure according to an embodiment.

FIG. 6 is a schematic diagram of assembly of circuit boards of a packaging structure according to an embodiment. As shown in FIG. 6, in a possible embodiment, first guide assemblies may be disposed between the first circuit board 300 and the second circuit board 400. The first guide assembly may include a guide pin 302 and a guide tube 402. The guide pin 302 may be disposed on the first circuit board 300 and may be disposed on the front side of the first circuit board 300. The guide tube 402 may be disposed on the second circuit board 400 and may be disposed on the front side of the second circuit board 400. During assembly, the first circuit board 300 may be fastened to the top cover 100, and the second circuit board 400 may be fastened to the bottom housing 200. Then, the top cover 100 and the bottom housing 200 are connected. In this case, the guide pin 302 and the guide tube 402 may be plug-connected, to preliminarily guide the top cover 100 and the bottom housing 200 for the connection. In this way, the top cover 100 and the bottom housing 200 may be accurately connected.

In a possible embodiment, a second guide assembly 308 may be further disposed between the first circuit board 300 and the second circuit board 400. The second guide assembly 308 may include a first signal connection terminal 306 and a second signal connection terminal 406. The first signal connection terminal 306 may be disposed on the first circuit board 300 and may be disposed on the front side of the first circuit board 300. The second signal connection terminal 406 may be disposed on the second circuit board 400 and may be disposed on the front side of the second circuit board 400. During assembly, the first signal connection terminal 306 and the second signal connection terminal 406 may be plug-connected. In this way, the top cover 100 and the bottom housing 200 can be precisely guided for the connection, so that the top cover 100 and the bottom housing 200 can be more accurately connected. In addition, after the first signal connection terminal 306 and the second signal connection terminal 406 are plug-connected for engagement, a signal connection between the first circuit board 300 and the second circuit board 400 can be implemented.

Figure 7:
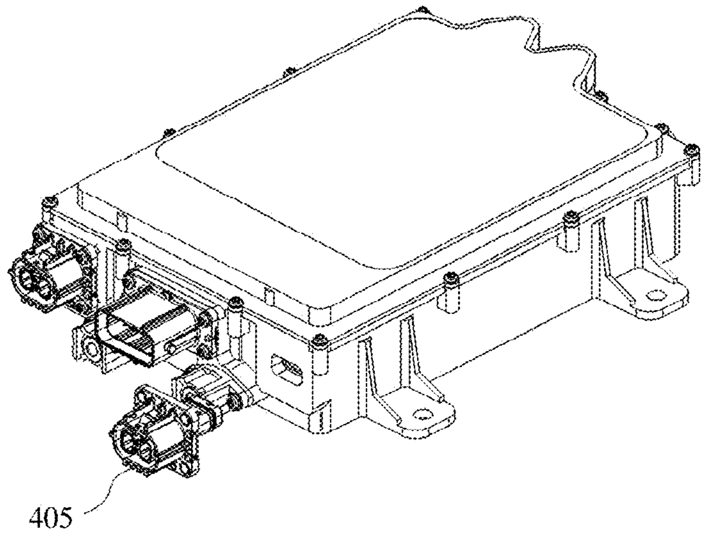
FIG. 7 is a schematic diagram of an external connection of a packaging structure according to an embodiment.

FIG. 7 is a schematic diagram of an external connection of a packaging structure according to an embodiment. As shown in FIG. 7, a third signal connection terminal may be disposed on the first circuit board or the second circuit board. For example, the third signal connection terminal may be disposed and located on the front side of the second circuit board. An external port may be disposed on the bottom housing at a position corresponding to the third signal connection terminal. The second circuit board and the first circuit board may communicate with the outside by using the third signal connection terminal. The third signal connection terminal may be used as a connection terminal of a plug-in connector. The plug-in connector includes the third signal connection terminal and an external connection terminal 405. The third signal connection terminal and the external connection terminal 405 are plug-connected, so that the second circuit board and the first circuit board communicate with the outside.

Figure 8:
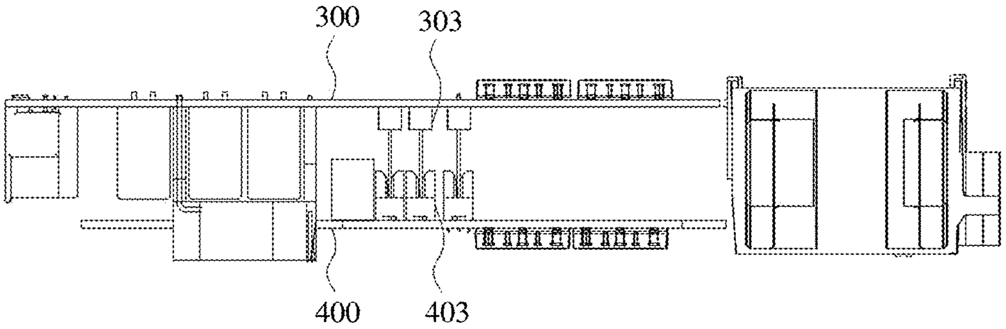
FIG. 8 is a schematic diagram of assembly of circuit boards of a packaging structure according to an embodiment.

FIG. 8 is a schematic diagram of assembly of circuit boards of a packaging structure according to an embodiment. As shown in FIG. 8, power connection assemblies may be disposed between the first circuit board 300 and the second circuit board 400. The power connection assembly may include a first power connection terminal 303 and a second power connection terminal 403. The first power connection terminal 303 may be disposed on the first circuit board 300 and may be disposed on the front side of the first circuit board 300. The second power connection terminal 403 may be disposed on the second circuit board 400 and may be disposed on the front side of the second circuit board 400. During assembly, after the first power connection terminal 303 and the second power connection terminal 403 are plug-connected and engage, a power connection between the first circuit board 300 and the second circuit board 400 can be implemented. The power connection component may be a blade-type connector and may absorb an assembly tolerance. Similarly, a third power connection terminal may be disposed on the first circuit board 300 or the second circuit board 400. For example, the third power connection terminal may be disposed and located on the front side of the second circuit board 400. An external port is also disposed on the bottom housing 200 at a position corresponding to the third power connection terminal. The second circuit board 400 and the first circuit board 300 may implement power connections to the outside by using the third power connection terminal.

Figure 9:
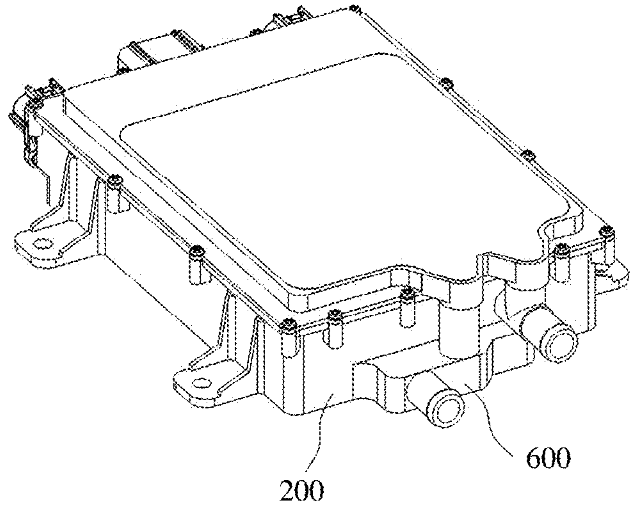
FIG. 9 is a schematic diagram of a structure of a connector of a packaging structure according to an embodiment.
Figure 10:
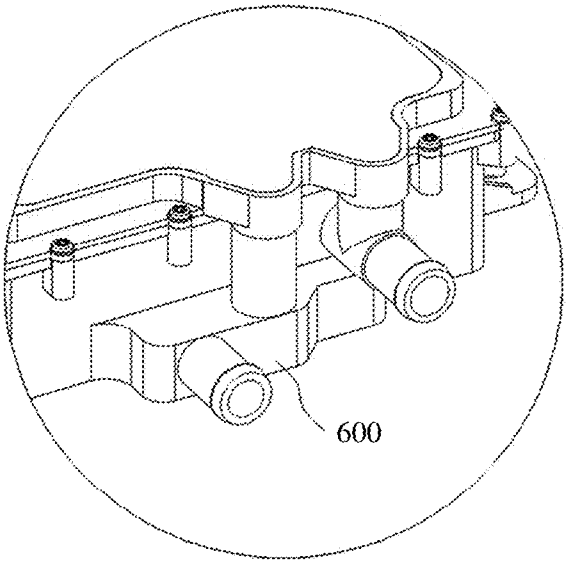
FIG. 10 is a partially enlarged view of FIG. 9.

FIG. 9 is a schematic diagram of a structure of a connector of a packaging structure according to an embodiment. FIG. 10 is a partially enlarged view of FIG. 9. As shown in FIG. 9 and FIG. 10, in a possible embodiment, a connector 600 may be disposed on an outer wall of the bottom housing 200. The connector 600 communicates with the external heat dissipation circulation system. In addition, the connector 600 separately communicates with the first heat transfer medium channel and the second heat transfer medium channel. The connector 600 is located outside the housing, to implement water and electricity isolation. If a heat transfer medium leaks, the leak only occurs outside the housing. Reliability of the packaging structure can be improved.

Figure 11:
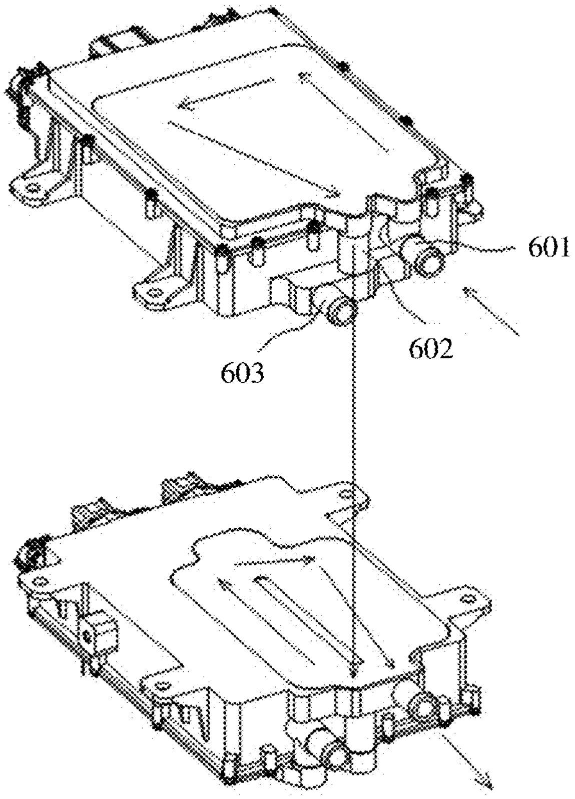
FIG. 11 is a schematic diagram of circulation of a heat transfer medium of a packaging structure according to an embodiment.

FIG. 11 is a schematic diagram of circulation of a heat transfer medium of a packaging structure according to an embodiment. As shown in FIG. 11, a first connection channel 601, a second connection channel 602, and a third connection channel 603 may be disposed inside the connector. A first end of the first connection channel 601 may communicate with the external heat dissipation circulation system, and a second end of the first connection channel 601 may communicate with a first end of the first heat transfer medium channel. A first end of the second connection channel 602 may communicate with a second end of the first heat transfer medium channel, and a second end of the second connection channel 602 may communicate with a first end of the second heat transfer medium channel. A first end of the third connection channel 603 may communicate with a second end of the second heat transfer medium channel, and a second end of the third connection channel 603 may communicate with the external heat dissipation circulation system. In this way, the first heat transfer medium channel and the second heat transfer medium channel may communicate with the external heat dissipation circulation system, and the first heat transfer medium channel and the second heat transfer medium channel are connected in series. As shown by arrows in the figure, a flow path of the heat transfer medium may be as follows: the external heat dissipation circulation system, the first connection channel 601, the first heat transfer medium channel, the second connection channel 602, the second heat transfer medium channel, the third connection channel 603, and the external heat dissipation circulation system.

Figure 12:
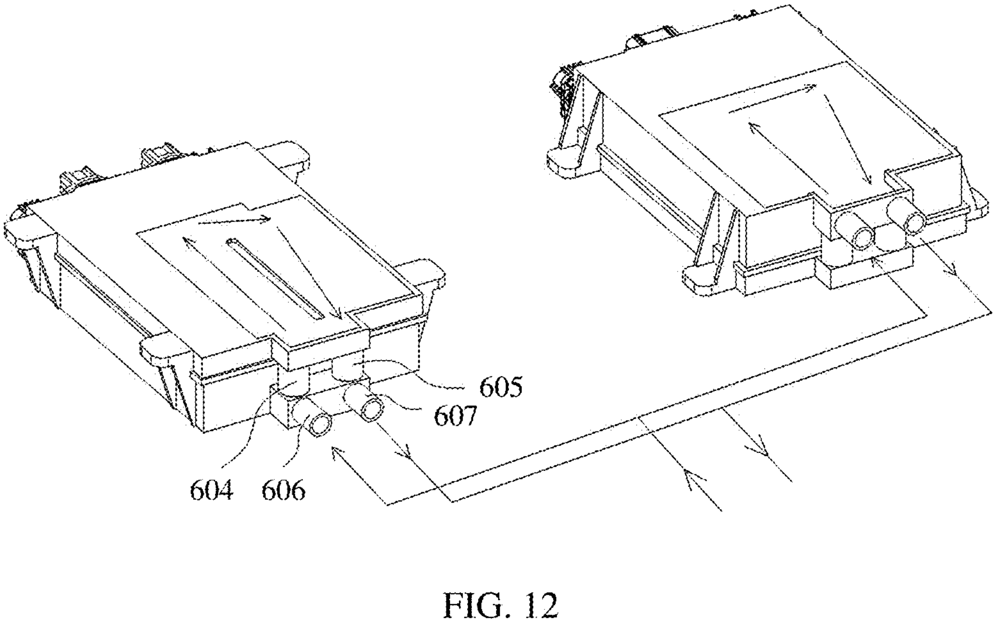
FIG. 12 is a schematic diagram of circulation of a heat transfer medium of a packaging structure according to another embodiment.

FIG. 12 is a schematic diagram of circulation of a heat transfer medium of a packaging structure according to another embodiment. As shown in FIG. 12, a fourth connection channel 604, a fifth connection channel 605, a sixth connection channel 606, and a seventh connection channel 607 may be disposed inside the connector. A first end of the fourth connection channel 604 may communicate with a first end of the first heat transfer medium channel, and a second end of the fourth connection channel 604 may communicate with a first end of the second heat transfer medium channel. A first end of the fifth connection channel 605 may communicate with a second end of the first heat transfer medium channel, and a second end of the fifth connection channel 605 may communicate with a second end of the second heat transfer medium channel. A first end of the sixth connection channel 606 may communicate with the external heat dissipation circulation system, and a second end of the sixth connection channel 606 may communicate with the fourth connection channel 604. A first end of the seventh connection channel 607 may communicate with the external heat dissipation circulation system, and a second end of the seventh connection channel 607 may communicate with the fifth connection channel 605. In this way, the first heat transfer medium channel and the second heat transfer medium channel may also communicate with the external heat dissipation circulation system, and the first heat transfer medium channel and the second heat transfer medium channel are connected in parallel. In actual application, a connection form of the first heat transfer medium channel and the second heat transfer medium channel may be selected based on a device layout inside the housing, a heat generation condition of the device, and the like. As shown by the arrows in the figure, a flow path of the heat transfer medium may be as follows: the external heat dissipation circulation system, the sixth connection channel 606, the fourth connection channel 604, the first heat transfer medium channel, the fifth connection channel 605, the seventh connection channel 607, and the external heat dissipation circulation system; and the external heat dissipation circulation system, the sixth connection channel 606, the fourth connection channel 604, the second heat transfer medium channel, the fifth connection channel 605, the seventh connection channel 607, and the external heat dissipation circulation system.

Figure 13:
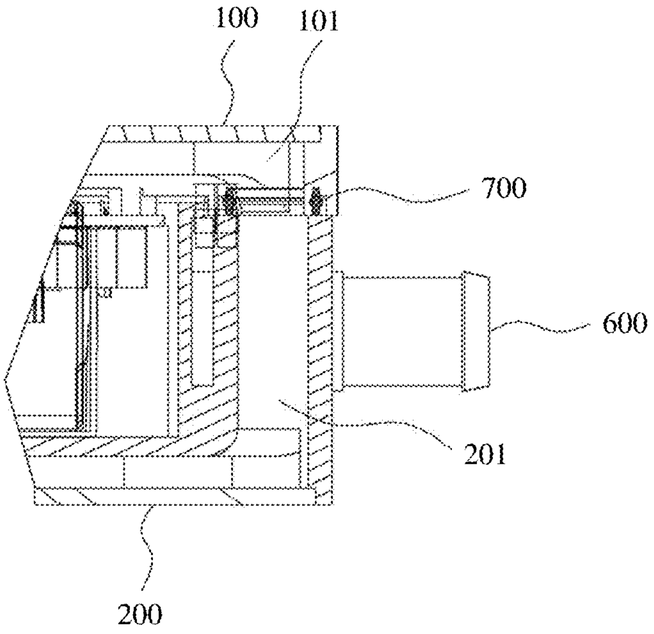
FIG. 13 is a schematic sectional view of a partial structure of a housing of a packaging structure according to an embodiment.

FIG. 13 is a schematic sectional view of a partial structure of a housing of a packaging structure according to an embodiment. As shown in FIG. 13, in a possible embodiment, the connector 600 and the bottom housing 200 may be integrally formed, so that the connector 600 directly communicates with the second heat transfer medium channel 201. The connector 600 is connected to the first heat transfer medium channel 101. A sealing ring 700 may be disposed at a joint between the connector 600 and the first heat transfer medium channel 101, to enhance airtightness of the connection. In addition, the sealing ring 700 may be disposed to absorb an assembly tolerance between the top cover 100 and the bottom housing 200 to some extent, thereby ensuring precise positioning between the first circuit board and the second circuit board.

In a possible embodiment, the first heat transfer medium channel may be U-shaped, and has a large heat dissipation area. The first heat transfer medium channel may also be of another shape. A shape of the first heat transfer medium channel may be based on distribution of first heating devices on the first circuit board. Therefore, it can be ensured that the first heat transfer medium channel passes a distribution position of the first heating device. The first heating device may be in contact with a region the first heat transfer medium channel passes, thereby improving heat dissipation effect of the first heating device. The second heat transfer medium channel and the first heat transfer medium channel may be of a same shape or different shapes. For example, the second heat transfer medium channel may be U-shaped, or may be of another shape. Similarly, a shape of the second heat transfer medium channel may be based on distribution of second heating devices on the second circuit board, to ensure heat dissipation effect of the second heating device.

Figure 14:
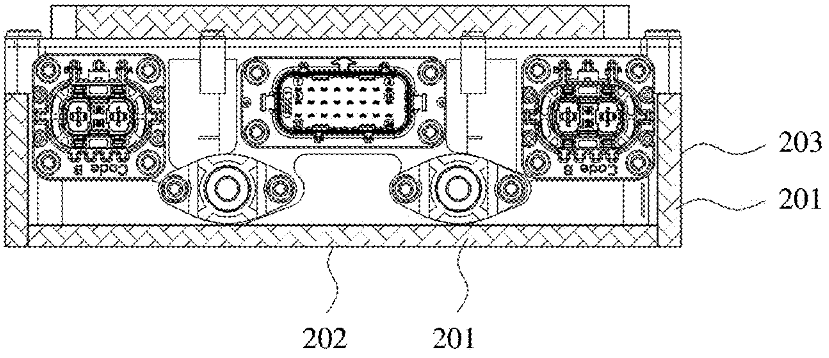
FIG. 14 is a schematic diagram of distribution of a second heat transfer medium channel of a packaging structure according to an embodiment.
Figure 15:
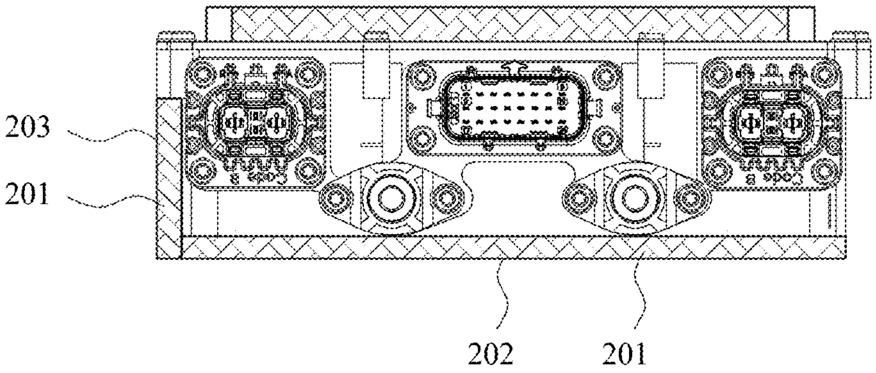
FIG. 15 is a schematic diagram of distribution of a second heat transfer medium channel of a packaging structure according to another embodiment.

FIG. 14 is a schematic diagram of distribution of a second heat transfer medium channel of a packaging structure according to an embodiment. FIG. 15 is a schematic diagram of distribution of a second heat transfer medium channel of a packaging structure according to another embodiment. In a possible embodiment, the bottom housing may include a bottom wall 202 and a plurality of first side walls 203. The plurality of first side walls 203 may be disposed on the bottom wall 202 in a circumferential direction of the bottom wall 202, and the plurality of first side walls 203 are sequentially connected. Therefore, the bottom housing may be understood as a groove-shaped structure. In actual application, the back side of the second circuit board may face the bottom wall 202 of the bottom housing. In some possible embodiments, the second heat transfer medium channel 201 may be disposed on the bottom wall 202 of the bottom housing. The heat transfer medium may pass the bottom wall 202 of the bottom housing, so that heat dissipation of a device on the back side of the second circuit board can be implemented. In some other possible embodiments, the second heat transfer medium channel 201 may extend from the bottom wall 202 of the bottom housing to the first side wall 203. In other words, the second heat transfer medium channel 201 may be distributed on both the bottom wall 202 and the first side wall 203 of the bottom housing. The heat transfer medium may pass the bottom wall 202 and the first side wall 203 of the bottom housing. In this way, the heat dissipation of the device on the back side of the second circuit board can be implemented. In addition, heat dissipation of a device close to the first side wall 203 of the bottom housing can also be implemented. The dissipation area is larger, and heat dissipation efficiency can be improved. The second heat transfer medium channel 201 may be distributed on the bottom wall 202 and the plurality of first side walls 203 of the bottom housing. For example, as shown in FIG. 14, the second heat transfer medium channel 201 is distributed on the bottom wall 202 and two opposite first side walls 203 of the bottom housing. Alternatively, as shown in FIG. 15, the second heat transfer medium channel 201 may be distributed on the bottom wall 202 and one first side wall 203 of the bottom housing. Distribution of the second heat transfer medium channel 201 on the bottom housing may be determined based on an actual layout of devices inside the housing.

Figure 16:
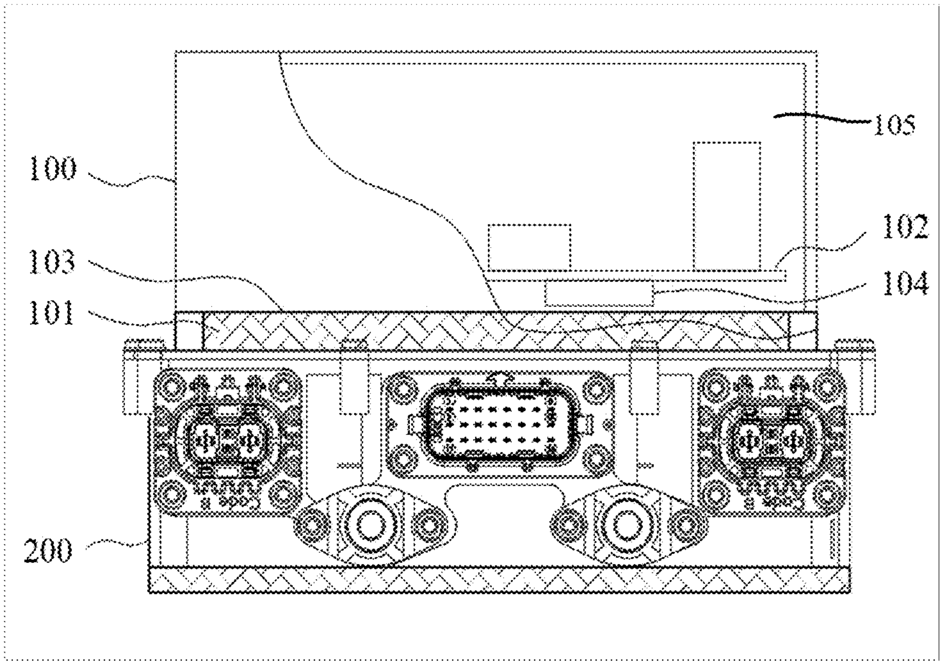
FIG. 16 is a schematic diagram of distribution of a first heat transfer medium channel of a packaging structure according to an embodiment.

FIG. 16 is a schematic diagram of distribution of a first heat transfer medium channel of a packaging structure according to an embodiment. As shown in FIG. 16, in a possible embodiment, the top cover 100 may have second accommodation space 105 inside. A third circuit board 102 may be disposed in the second accommodation space 105. The top cover 100 may have a second side wall 103 facing the bottom housing 200. The first heat transfer medium channel 101 may be disposed in the second side wall 103. A back side of the third circuit board 102 may face the second side wall 103. A fourth heating device 104 may be disposed on the third circuit board 102. The fourth heating device 104 may be disposed on the back side of the third circuit board 102, and the fourth heating device 104 may press against the second side wall 103. There may be at least one fourth heating device 104, and there may be at least one type of the fourth heating device 104. During arrangement, the first heating device may press against the second side wall 103. Therefore, the first heating device and the fourth heating device 104 may share the first heat transfer medium channel 101. The packaging structure may have three circuit boards as a whole and the packaging structure may have higher power density.

The foregoing descriptions are merely implementations but are not intended to limit the scope of the embodiments. Any variation or replacement readily figured out by a person skilled in the art shall fall within the scope of the embodiments.

What is claimed is:

1. A packaging structure, comprising:

a housing, wherein the housing has a first accommodation space inside, and the housing comprises:

a top cover which has a first heat transfer medium channel disposed within a volume of the top cover, a bottom housing which has a second heat transfer medium channel disposed within a volume of the bottom housing, wherein the top cover and the bottom housing are connected to form the housing, a connector which is disposed on an outer wall of the bottom housing, wherein the connector is internally provided with a first connection channel, a second connection channel, and a third connection channel, wherein a first end of the first connection channel is configured to communicate with an external heat dissipation circulation system and a second end of the first connection channel is configured to communicate with a first end of the first heat transfer medium channel, a first end of the second connection channel is configured to communicate with a second end of the first heat transfer medium channel and a second end of the second connection channel is configured to communicate with a first end of the second heat transfer medium channel, a first end of the third connection channel is configured to communicate with a second end of the second heat transfer medium channel, and a second end of the third connection channel is configured to communicate with the external heat dissipation circulation system; and a power component, wherein the power component is disposed in the first accommodation space and the power component comprises:

a first circuit board attached to an inner wall of the top cover facing the first accommodation space; and a second circuit board attached to an inner wall of the bottom housing facing the first accommodation space, wherein the first circuit board and the second circuit board are disposed opposite to each other, at least one first heating device is disposed on the first circuit board, the first heating device is configured to press against the inner wall of the top cover, at least one second heating device is disposed on the second circuit board, and the second heating device is configured to press against the inner wall of the bottom housing.

2. The packaging structure according to claim 1, wherein a guide assembly is disposed between the first circuit board and the second circuit board and comprises:

a guide pin disposed on the first circuit board; and a guide tube disposed on the second circuit board, wherein the guide pin and the guide tube are plug-connected.

3. The packaging structure according to claim 1, wherein a guide assembly is disposed between the first circuit board and the second circuit board and comprises:

a first signal connection terminal disposed on the first circuit board; and a second signal connection terminal disposed on the second circuit board, wherein the first signal connection terminal and the second signal connection terminal are plug-connected.

4. The packaging structure according to claim 1, wherein a third heating device is disposed in the housing and configured to press against at least one of the bottom housing and the top cover.

5. The packaging structure according to claim 4, wherein the first circuit board has a first avoidance notch and the third heating device is configured to pass through the first avoidance notch to press against the inner wall of the top cover; and the second circuit board has a second avoidance notch and the third heating device is configured to pass through the second avoidance notch to press against the inner wall of the bottom housing.

6. The packaging structure according to claim 1, wherein the connector and the bottom housing are integrally formed.

7. The packaging structure according to claim 1, wherein a sealing ring is disposed at a joint between the connector and the first heat transfer medium channel.

8. The packaging structure according to claim 1, wherein at least one of: the first heat transfer medium channel is U-shaped, or the second heat transfer medium channel is U-shaped.

9. The packaging structure according to claim 1, wherein the bottom housing comprises a bottom wall and a plurality of first side walls, the plurality of first side walls is disposed on the bottom wall in a circumferential direction of the bottom wall and sequentially connected; and the second heat transfer medium channel is disposed on the bottom wall.

10. The packaging structure according to claim 9, wherein the second heat transfer medium channel extends from the bottom wall to the first side wall.

11. The packaging structure according to claim 1, wherein the top cover has a second accommodation space inside, a third circuit board is disposed in the second accommodation space, and at least one fourth heating device is disposed on the third circuit board, the top cover has a second side wall facing the bottom housing, the first heat transfer medium channel is disposed in the second side wall, and the fourth heating device is configured to press against the second side wall, and the first heating device is configured to press against the second side wall.

12. A vehicle-mounted charging device comprising a packaging structure, wherein the packaging structure comprises:

a housing, wherein the housing has a first accommodation space inside, and the housing comprises:

a top cover which has a first heat transfer medium channel disposed within a volume of the top cover, and a bottom housing which has a second heat transfer medium channel disposed within a volume of the bottom housing, wherein the top cover and the bottom housing are connected to form the housing, a connector which is disposed on an outer wall of the bottom housing, wherein the connector is internally provided with a first connection channel, a second connection channel, and a third connection channel, wherein a first end of the first connection channel is configured to communicate with an external heat dissipation circulation system and a second end of the first connection channel is configured to communicate with a first end of the first heat transfer medium channel, a first end of the second connection channel is configured to communicate with a second end of the first heat transfer medium channel and a second end of the second connection channel is configured to communicate with a first end of the second heat transfer medium channel, a first end of the third connection channel is configured to communicate with a second end of the second heat transfer medium channel, and a second end of the third connection channel is configured to communicate with the external heat dissipation circulation system; and a power component disposed in the first accommodation space, wherein the power component comprises:

a first circuit board attached to an inner wall of the top cover facing the first accommodation space; and a second circuit board attached to an inner wall of the bottom housing facing the first accommodation space, wherein the first circuit board and the second circuit board are disposed opposite to each other, at least one first heating device is disposed on the first circuit board, the first heating device is configured to press against the inner wall of the top cover, at least one second heating device is disposed on the second circuit board, and the second heating device is configured to press against the inner wall of the bottom housing.

13. The vehicle-mounted charging device according to claim 12, wherein a guide assembly is disposed between the first circuit board and the second circuit board and comprises:

a guide pin disposed on the first circuit board; and a guide tube disposed on the second circuit board, wherein the guide pin and the guide tube are plug-connected.

14. The vehicle-mounted charging device according to claim 12, wherein a guide assembly is disposed between the first circuit board and the second circuit board and comprises:

a first signal connection terminal disposed on the first circuit board; and a second signal connection terminal disposed on the second circuit board, wherein the first signal connection terminal and the second signal connection terminal are plug-connected.

15. The vehicle-mounted charging device according to claim 12, wherein a third heating device is disposed in the housing and configured to press against at least one of the bottom housing and the top cover.

16. The vehicle-mounted charging device according to claim 15, wherein the first circuit board has a first avoidance notch and the third heating device is configured to pass through the first avoidance notch to press against the inner wall of the top cover; and the second circuit board has a second avoidance notch and the third heating device is configured to pass through the second avoidance notch to press against the inner wall of the bottom housing.

17. The vehicle-mounted charging device according to claim 12, wherein the connector and the bottom housing are integrally formed.

18. The vehicle-mounted charging device according to claim 12, wherein a sealing ring is disposed at a joint between the connector and the first heat transfer medium channel.

19. The vehicle-mounted charging device according to claim 12, wherein at least one of: the first heat transfer medium channel is U-shaped, or the second heat transfer medium channel is U-shaped.

20. The vehicle-mounted charging device according to claim 12, wherein the bottom housing comprises a bottom wall and a plurality of first side walls, the plurality of first side walls is disposed on the bottom wall in a circumferential direction of the bottom wall and sequentially connected; and the second heat transfer medium channel is disposed on the bottom wall.

* * * * *